(12) United States Patent
Richter et al.

(10) Patent No.: US 7,994,059 B2
(45) Date of Patent: *Aug. 9, 2011

(54) ENHANCED STRESS TRANSFER IN AN INTERLAYER DIELECTRIC BY USING AN ADDITIONAL STRESS LAYER ABOVE A DUAL STRESS LINER IN A SEMICONDUCTOR DEVICE

(75) Inventors: Ralf Richter, Dresden (DE); Martin Gerhardt, Dresden (DE); Martin Mazur, Pulsnitz (DE); Joerg Hohage, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 737 days.

This patent is subject to a terminal disclaimer.

(21) Appl. No.: 11/865,796

(22) Filed: Oct. 2, 2007

(65) Prior Publication Data

US 2008/0179661 A1 Jul. 31, 2008

(30) Foreign Application Priority Data

Jan. 31, 2007 (DE) .......................... 10 2007 004 824
Apr. 10, 2007 (DE) .......................... 10 2007 016 897

(51) Int. Cl.
*H01L 21/331* (2006.01)
(52) U.S. Cl. ......... 438/694; 438/695; 438/696; 257/327
(58) Field of Classification Search .................. 438/694, 438/695, 696
See application file for complete search history.

(56) References Cited

U.S. PATENT DOCUMENTS

| | | | |
|---|---|---|---|
| 6,531,413 B2 | 3/2003 | Hsieh et al. | 438/782 |
| 2005/0093078 A1* | 5/2005 | Chan et al. | 257/374 |
| 2005/0263825 A1* | 12/2005 | Frohberg et al. | 257/369 |
| 2006/0223290 A1 | 10/2006 | Belyansky et al. | 438/520 |
| 2006/0226490 A1 | 10/2006 | Burnett et al. | 257/365 |
| 2007/0018203 A1* | 1/2007 | Atanackovic et al. | 257/254 |
| 2009/0057809 A1* | 3/2009 | Richter et al. | 257/499 |

FOREIGN PATENT DOCUMENTS

| | | |
|---|---|---|
| DE | 102004026149 | 12/2005 |
| DE | 102005046978 | 4/2007 |

OTHER PUBLICATIONS

Translation of Official Communication Dated Oct. 24, 2007, for serial No. 102007016897.9-33.

* cited by examiner

*Primary Examiner* — Thinh T Nguyen
(74) *Attorney, Agent, or Firm* — Williams, Morgan & Amerson, P.C.

(57) ABSTRACT

By forming an additional stressed dielectric material after patterning dielectric liners of different intrinsic stress, a significant increase of performance in transistors may be obtained while substantially not contributing to patterning non-uniformities during the formation of respective contact openings in highly scaled semiconductor devices. The additional dielectric layer may be provided with any type of intrinsic stress, irrespective of the previously selected patterning sequence.

9 Claims, 8 Drawing Sheets

ENHANCED STRESS TRANSFER IN AN INTERLAYER DIELECTRIC BY USING AN ADDITIONAL STRESS LAYER ABOVE A DUAL STRESS LINER IN A SEMICONDUCTOR DEVICE

BACKGROUND OF THE INVENTION

1. Field of the Invention

Generally, the present disclosure relates to the field of integrated circuits, and, more particularly, to the manufacture of field effect transistors on the basis of stressed dielectric layers formed above the transistors, such as stressed contact etch stop layers used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 65 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIG. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer, if a silicon-on-insulator (SOI) configuration is considered. In the example shown, the first and second device areas 120A, 120B may comprise a plurality of transistor elements with a lateral distance according to the design rules of the technology under consideration. The transistors in the first and second device regions 120A, 120B may comprise a gate electrode 121 formed on a respective gate insulation layers 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device regions 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device regions 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of 2× a layer thickness of the silicon nitride layer 130, which, in combination with the limited conformal fill behavior, may even result in corresponding defects, such as voids 132A and the like. Moreover, due to the pronounced surface topography at the seams 132, the silicon dioxide layer 131 may have a significantly increased thickness at this area due to locally different deposition conditions compared to other areas, which may further contribute to etch non-uniformities during the subsequent patterning of the layer 130.

Furthermore, in this manufacturing stage, the semiconductor device 100 may comprise a resist mask 103 exposing the first device region 120A, while covering the second device region 120B. In this case, it may be assumed that the intrinsic stress of the silicon nitride layer 130 may be appropriately selected so as to enhance the transistor performance in the second first device region 120B.

A typical process flow for forming the semiconductor device 100 as shown in FIG. 1a may comprise the following processes. The gate electrodes 121 and the gate insulation layers 123 may be formed and patterned on the basis of well-established process techniques, including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 GigaPascal (GPa) and even more of compressive stress or up to 1 GPa or even significantly higher of tensile stress may be created to enhance the performance of the transistor in the first device region 110. Due to the less pronounced conformality of the silicon nitride deposition process above a certain layer thickness and for increased aspect ratios, as may occur in highly scaled devices caused by the reduced distance between the neighboring transistor elements at moderately dimensioned gate heights in densely packed device areas, as shown, the silicon nitride material may merge in the lateral growth direction between closely spaced transistor elements, thereby forming the respective seam 131, or respective overhangs may form, thereby resulting in the void 132A. Thus, in the subsequent deposition of the silicon dioxide layer 132, the local deposition conditions at the seam 131 may result in a non-uniformity of the layer thickness, thereby creating a locally significantly enhanced silicon dioxide thickness, which may even amount to a thickness of up to three to four times the thickness at areas distant from the seam 131. On the other hand, the void 132A may give rise to respective etch non-uniformities in a contact etch process to be performed in a later stage.

After the deposition of the silicon dioxide layer 132, the resist mask 103 may be formed on the basis of well-established photolithography techniques. Next, an appropriately designed etch process may be performed in order to remove a portion of the layers 130 and 131 from the second device region 120B. During the corresponding etch process, the silicon dioxide material of the layer 131 may be removed first, followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device region 120A, which may result in respective non-uniformities during further processing, for instance during the deposition of a further dielectric layer of high intrinsic stress designed to enhance the transistor performance of the transistors in the first device region 120A.

FIG. 1b schematically illustrates the semiconductor device 100 at a further advanced manufacturing stage. As shown, a second dielectric layer 140 may be formed above the first and second device regions 120A, 120B, with a corresponding material residual, also referred to as 132 and consisting of material of the layer 131 and 130, while the respective defects, that is, a void 132A, may still be present in the second device region 120B. Consequently, due to the material residual 132, which may be comprised of different materials and may have a different type of intrinsic stress compared to the surrounding material of the layer 140, as previously explained, the respective stress transfer mechanism may be deteriorated, while, additionally, the residual 132 may provide respective etch non-uniformities in the subsequent patterning sequence for forming respective contact openings. Similarly, the void 132A in the second device region 120B may also result in a reduced stress transfer mechanism, as well as degraded etch uniformity during subsequent processing. Furthermore, at the manufacturing stage shown in FIG. 1b, a corresponding resist mask 104 is provided for protecting the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role during the etch process 105, since, in combination with the surface topography generated during the deposition of the layer 130, a substantially complete removal of the exposed portion of the layer 140 may depend on the deposition capabilities of the subsequent deposition for a given device geometry. Hence, the thickness of the layer 140 may have to be within specified limits in order to substantially completely remove the layer 140 of the second device region 120B, while not unduly affecting the overall stress transfer mechanism. Thus, a respective high degree of conformality may be required for the deposition of the layer 140 in order to efficiently remove the exposed portion thereof by the process 105, which may be controlled on the basis of the etch indicator 131, thereby requiring a moderately uniform layer thickness for substantially completely removing the material of the layer 140 without unduly removing the material of the layer 130.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS and the like, which may be followed by respective planarization processes, if required. Thereafter, respective contact openings 151 may be formed, which may, in some cases, for instance in dense RAM regions, connect to the device layer at areas located between respective closely spaced transistors. Thus, the corresponding irregularities 132, 132A may also affect the corresponding process, thereby resulting in less reliable contacts or even total contact failures.

As a consequence, upon further device scaling, the respective limitation of deposition processes for dielectric materials of high intrinsic stress may require a significant reduction of the layer thickness to comply with increased aspect ratios encountered in advanced device geometries. However, in this case, the respective strain induced by the stressed dielectric materials may also be significantly reduced, thereby also reducing transistor performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of a reduced efficiency of strain-inducing mechanisms in highly scaled semiconductor devices and/or respective non-uniformities during the patterning of contact openings by appropriately adapting the patterning sequence of forming differently stressed dielectric layers above respective transistor devices in order to reduce any deposition and etch induced non-uniformities and additionally provide a further stressed dielectric material within the restrictions and constraints imposed by the device geometry and the respective processes involved. That is, the patterning sequence for providing two differently stressed dielectric layers may be performed on the basis of process parameters that enable a highly efficient deposition of both dielectric materials, wherein, after the removal of unwanted portions of these layers, at least one further highly stressed dielectric material may be formed within the corresponding process margins, thereby reducing any patterning-induced non-uniformities during the further processing while significantly enhancing the strain-inducing mechanism at least for one type of transistor element. Consequently, the respective process sequence may be readily adapted to any further scaled devices once an appropriate patterning regime for differently stressed dielectric layers has been established.

According to one illustrative embodiment disclosed herein, a method comprises forming a first stress-inducing layer above a plurality of first transistors that are formed above a substrate, wherein the first stress-inducing layer generates a first type of stress. Furthermore, a second stress-inducing layer is formed above a plurality of second transistors, wherein the second stress-inducing layer generates a second type of stress other than the first type of stress. Additionally, the method comprises forming a third stress-inducing layer above the first and the second transistors, wherein the third stress-inducing layer generates the first or the second type of stress.

According to another illustrative embodiment disclosed herein, a method comprises determining a first target value for a thickness of a first stress-inducing layer to be formed above a first transistor of a first conductivity type. The method further comprises determining a second target value for a thickness of a second stress-inducing layer to be formed above the second transistor of a second conductivity type other than the first conductivity type, wherein at least one of said first and second target values is less than a target thickness of stress-inducing material to be formed above the first and second transistors. Then, the first and second stress-inducing layers are formed on the basis of the first and second target values and a third stress-inducing layer is formed above the first and second transistors on the basis of a third target value so as to obtain the target thickness.

According to yet another illustrative embodiment disclosed herein, a semiconductor device comprises a first dielectric layer formed above a first transistor, wherein the first dielectric layer induces a first type of stress. The device further comprises a second dielectric layer formed above a second transistor, wherein the second dielectric layer induces a second type of stress other than the first type of stress. Finally, the semiconductor device further comprises a third dielectric layer formed on the first and the second dielectric layers, wherein the third dielectric layer induces the first type of stress above the first transistor and wherein the first, second and third dielectric layers are comprised of substantially the same material composition.

BRIEF DESCRIPTION OF THE DRAWINGS

The disclosure may be understood by reference to the following description taken in conjunction with the accompanying drawings, in which like reference numerals identify like elements, and in which.

Figure 1A:
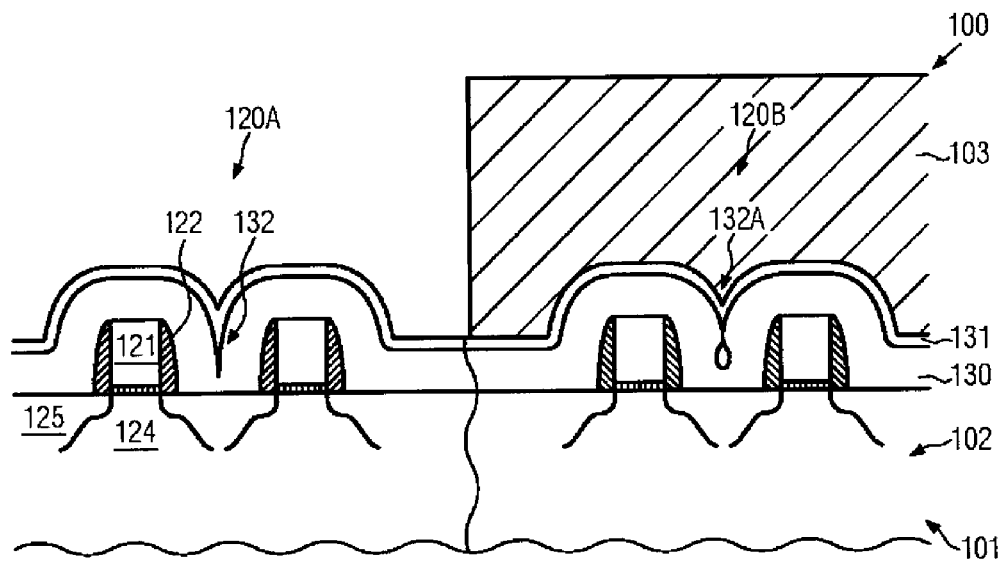
FIGS. 1a-1c schematically illustrate cross-sectional views at various manufacturing stages in forming differently stressed contact etch stop layers in a semiconductor device including densely spaced transistor elements according to a conventional method.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced process technique for forming stress-inducing layers above device regions including densely spaced transistor elements on the basis of a dual stress liner approach with enhanced scalability. A dual stress liner approach may be understood as a sequence of depositing a first stress-inducing material of a first type of intrinsic stress, patterning the first material to remove it from unwanted device areas, depositing a second stress-inducing material of a second type of stress and removing the second material from above the first material. According to aspects disclosed herein, the capabilities of the deposition process, possibly in combination with subsequent patterning regimes for forming the highly stressed dielectric materials, are taken into consideration in order to significantly reduce any non-uniformities during the patterning sequence and during subsequent process steps for forming a respective contact structure, by extending the dual stress liner sequence by forming at least one of the layers of different intrinsic stress in two or more deposition steps, thereby relaxing the process-induced constraints at each individual deposition process. In some aspects, the respective process window substantially determined by the device geometry and the corresponding deposition technique may be substantially completely "utilized" in that an additionally highly stressed dielectric material may be provided above respective stressed dielectric materials substantially without contributing to further non-uniformities during the further manufacturing processes. Consequently, the limits defined by the device geometry under consideration and the available process capabilities of the deposition process may be respected, thereby providing a substantially "self scaling" patterning regime, in which, for a given process strategy, an increased amount of stressed dielectric material may be provided, at least for one transistor type. Hence, the process strategy may be effectively extended to further scaled devices, once a basic dual stress liner approach has been identified.

In some illustrative aspects, the additional stressed dielectric material may not be removed from device areas, which actually have formed thereon a material of a different type of intrinsic stress, thereby enhancing the uniformity of the subsequent patterning of contact openings in a corresponding interlayer dielectric material. In this case, in some illustrative embodiments, a respective stress-relaxing process may then be locally performed for transistor elements, in which the additional dielectric material may result in a reduced stressed transfer mechanism. In this case, the performance of one type of transistor may be significantly increased, while substantially not affecting the operational behavior of the other type of transistor while, on the other hand, superior process uniformity may be provided during further processing of the device for both types of transistors.

In other illustrative embodiments, a respective portion of the additional stressed dielectric material may be provided with different intrinsic stress for both types of transistors, thereby enhancing the performance of both transistor types, while also providing highly uniform process conditions during the deposition of an interlayer dielectric material and the patterning thereof, while the process- and geometry-induced constraints may be relaxed in both cycles for depositing and patterning the respective sub-layers of the dielectric materials of different intrinsic stress.

Figure 2A:
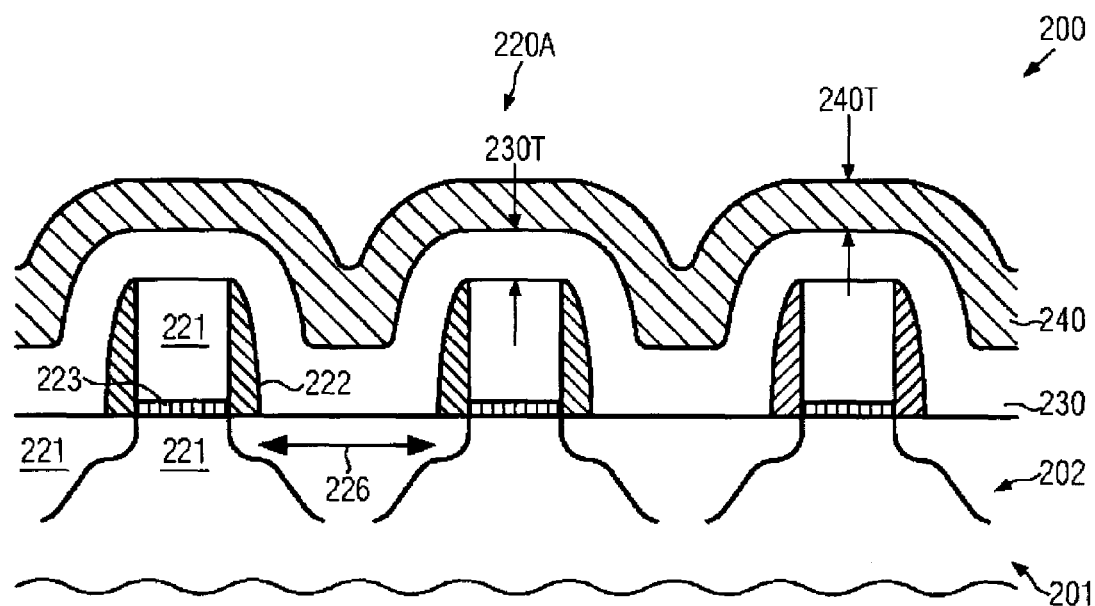
FIGS. 2a-2b schematically illustrate cross-sectional views of device regions including densely packed transistor elements representing a device geometry that is to receive respective stressed dielectric materials on the basis of an appropriately selected target thickness according to illustrative embodiments.
Figure 2B:
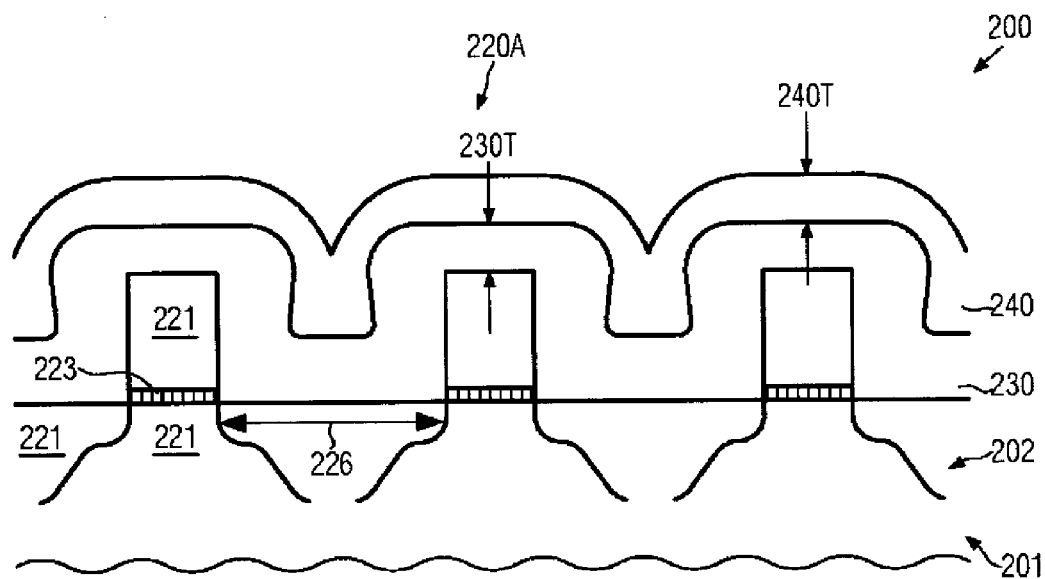

With reference to FIGS. 2a-2b, some aspects will now be described so as to obtain respective parameters for evaluating a corresponding process sequence for forming stress-inducing layers in a dual stress liner approach, wherein, in some aspects, the corresponding parameters values may be used to appropriately design a "multi-step" stress liner technique, in which the provision of at least one type of stress-inducing material is accomplished in at least two separate deposition cycles.

FIG. 2a schematically illustrates a cross-sectional view of a semiconductor device 200, wherein a specified device region 220A may be illustrated, which may comprise a plurality of transistor elements. The respective transistor elements in the device region 220A may represent densely packed circuit elements, as are typically encountered in highly scaled semiconductor devices, such as microprocessors, storage chips and the like. For instance, the device region 220A may represent a static RAM (random excess memory) area of a sophisticated memory chip or a microprocessor and the like. The device region 220A may be located above a substrate 201, which may represent any appropriate carrier material, such as a semiconductor bulk substrate, for instance based on silicon, or an insulating material having formed thereon a substantially crystalline semiconductor layer 202, thereby forming a respective silicon-on-insulator (SOI) configuration. It should be appreciated that the semiconductor device 200 may comprise other device regions, which may include respective transistor elements arranged with a comparable distance, or with an increased distance, when less densely packed areas are considered. Furthermore, various device regions of the semiconductor device 200 may be formed on the basis of different architectures, such as a bulk configuration or an SOI architecture. The transistor elements in the device region 220A may each comprise a gate electrode 221 on a gate insulation layer 223 that separates the gate electrode 221 from a corresponding channel region 224, which in turn is flanked by respective drain and source regions 225. In the embodiment shown in FIG. 2a, the respective transistor elements may further comprise a more or less complex sidewall spacer structure 222, depending on device requirements. The corresponding sidewall spacer structures 222 may substantially define a distance 226 between neighboring transistor elements and may, therefore, in combination with the respective height of the gate electrode 221, define a respective aspect ratio that may impose certain limitations with respect to a corresponding deposition process for forming stressed dielectric layers 230 and 240.

Figure 1B:
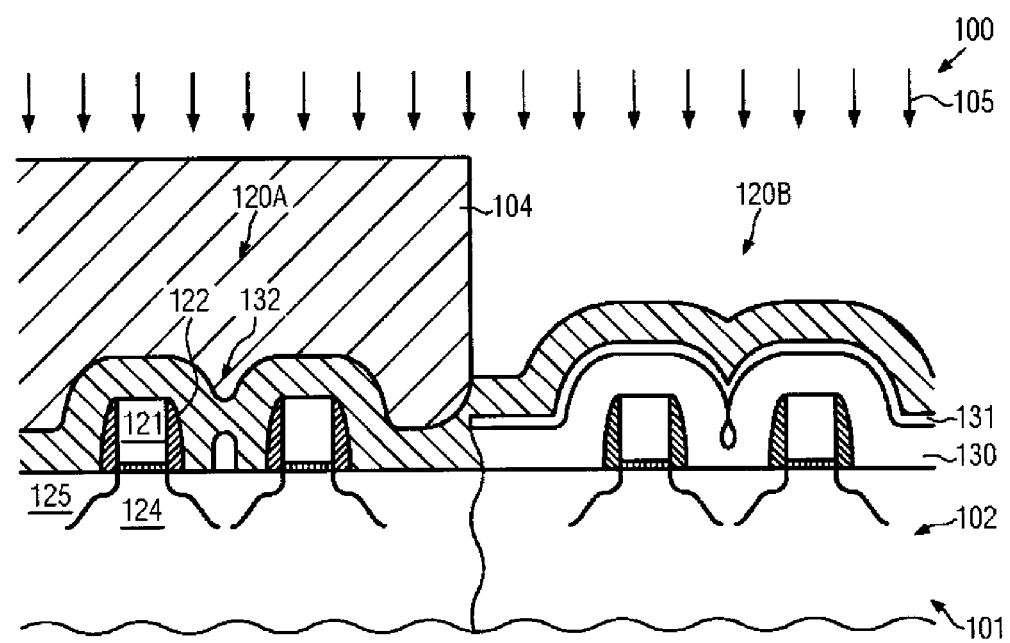
Figure 1C:
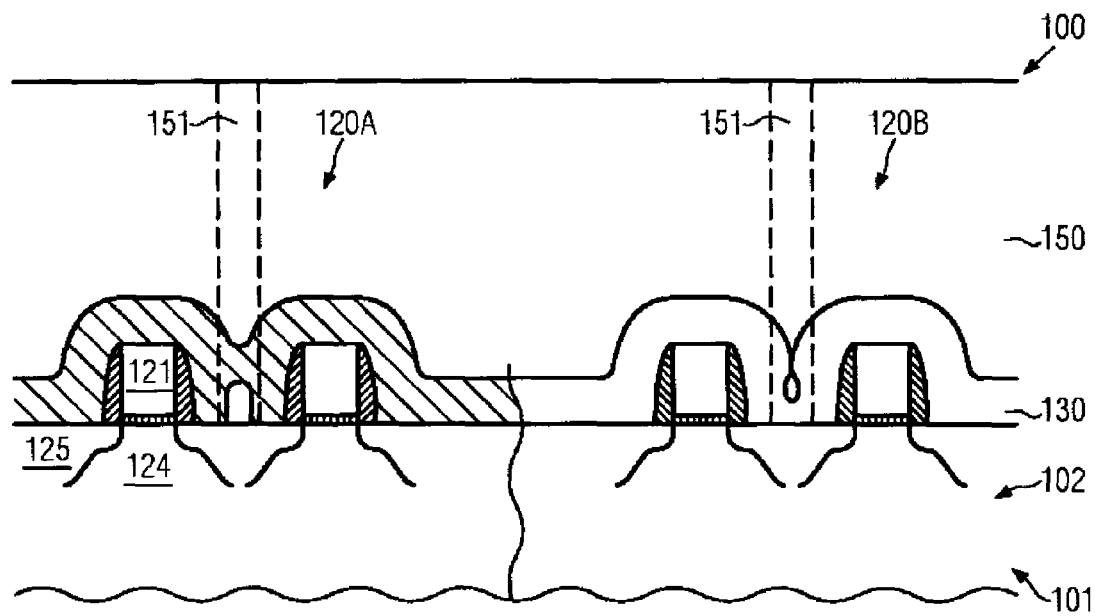

As previously explained, for advanced semiconductor devices, the length of the gate electrode 221 may be 50 nm or significantly less, wherein a respective height of the gate electrodes 221 may be 100 nm and less. Typically, in view of performance gain of advanced semiconductor devices, the lateral dimensions of the gate electrode 221 may be steadily reduced for the benefit of increased transistor performance, whereas the corresponding gate height may not be proportionally reduced, thereby steadily increasing the respective aspect ratio, since the spacing 226 may be reduced in a similar manner as the gate length. Since presently available deposition recipes for forming highly stressed silicon nitride material may have limitations with respect to their gap fill capabilities, i.e., step coverage, increasingly restrictive constraints may be imposed on the respective deposition processes, thereby requiring a reduction of the corresponding layer thickness of the highly stressed layers 230, 240. On the other hand, an efficient strain-inducing mechanism may not only depend on the amount of intrinsic stress induced by the layers 230, 240, but also on the effective layer thickness positioned close to the channel region 224. Thus, an increasing aspect ratio created by the ongoing scaling of feature sizes may result in less efficient strain transfer mechanisms based on well-established dual stress liner techniques. Consequently, some aspects of the subject matter disclosed herein provide a technique in which the amount of highly stressed dielectric material may be increased while respecting the corresponding process limits imposed by the deposition process under consideration and the device geometry. For this purpose, the dielectric layers 230, 240 may be formed on the basis of a respective process technique, which may be designed so as to obtain a high intrinsic stress of different types in the layers 230, 240. For instance, the layer 230 may be comprised of silicon nitride, carbon containing silicon nitride, silicon carbide, silicon dioxide and the like, having a high compressive stress, which may amount to 3 GigaPascal and even higher, whereas the layer 240 may be comprised of silicon nitride and the like of high tensile stress amounting to approximately 1 GigaPascal and even more. In other cases, the layer 230 may be provided with tensile stress and the layer 240 may be formed as a compressively stressed material. Moreover, the device region 220A may represent, in some illustrative embodiments, one of a plurality of test structures, which may be formed on the same substrate or on different substrates in order to form the respective layers 230, 240 for the device configuration defined by a plurality of transistor elements in the region 220A on the basis of different target values for the layer thickness or for any other different process parameters. For example, based on a device configuration defined by the transistor elements in the region 220A, the layer 230 may be formed above a plurality of respective structures on the basis of different target values for the thickness 230T in order to identify an upper limit of the gap fill capability of the deposition process under consideration. For example, the thickness 230T may be varied across the various test structures so as to determine a respective maximum thickness at which corresponding voids, such as illustrated in FIGS. 1a-1c, may not be created. The corresponding value determined may then be used as a maximum thickness for the combined layer thickness of the layers 230, 240 during actual manufacturing processes for forming a stressed dielectric material above respective transistor structures.

In other illustrative embodiments, the respective process limits for the given device configuration and a respective deposition process may be determined in a more refined manner in that the ability for substantially completely removing the layer 240 may be "included" in the estimation of determining the gap fill capability of the respective deposition processes under consideration. That is, as previously explained, in one device region, both layers 230, 240 may be provided in the form of a layer stack, requiring an efficient removal of the upper stressed dielectric material, while not substantially negatively affecting the underlying stressed layer. Consequently, respective maximum values for the thickness 230T and 240T may be determined so as to enable a substantially complete removal of the upper layer 240 while not unduly removing material of the layer 230. It should be appreciated that the corresponding deposition processes may not be symmetric with respect to the gap fill capabilities due to the difference in material density, process parameters and the like, although both layers 230, 240 may be comprised of essentially the same material composition, such as silicon nitride. Consequently, an "allowable" thickness range for the layers 230 and 240 may be individually determined, which in turn provides a corresponding allowable range for a combined thickness of the layers 230, 240. It should be appreciated that respective measurement data for estimating appropriate target values for the layers 230, 240 of actual product devices may be obtained on the basis of cross-sectional analysis techniques, scatterometry measurements and the like.

FIG. 2b schematically illustrates the semiconductor device 200 in accordance with further illustrative embodiments, in which the device region 220A may comprise the transistor elements with a more pronounced surface topography, due to reduced or missing sidewall spacer structures, in order to enhance the stress transfer mechanism by positioning the highly stressed material more closely to the respective channel regions 224. Consequently, the respective target values for a thickness 230T and 240T may also be determined on the basis of a corresponding modified device configuration. Consequently, based on the respective configurations as shown in FIGS. 2a and 2b, any intermediate configurations for a given gate length of the transistor elements may be obtained by, for instance, "interpolation" in order to provide a certain degree of flexibility in determining appropriate target values, depending on the respective process strategy in forming and removing the respective sidewall spacers 222.

In some illustrative embodiments, the corresponding target values determined above may be used to form the material layers 230, 240 in actual product devices, as will be described with reference to FIGS. 2c-2f.

Figure 2C:
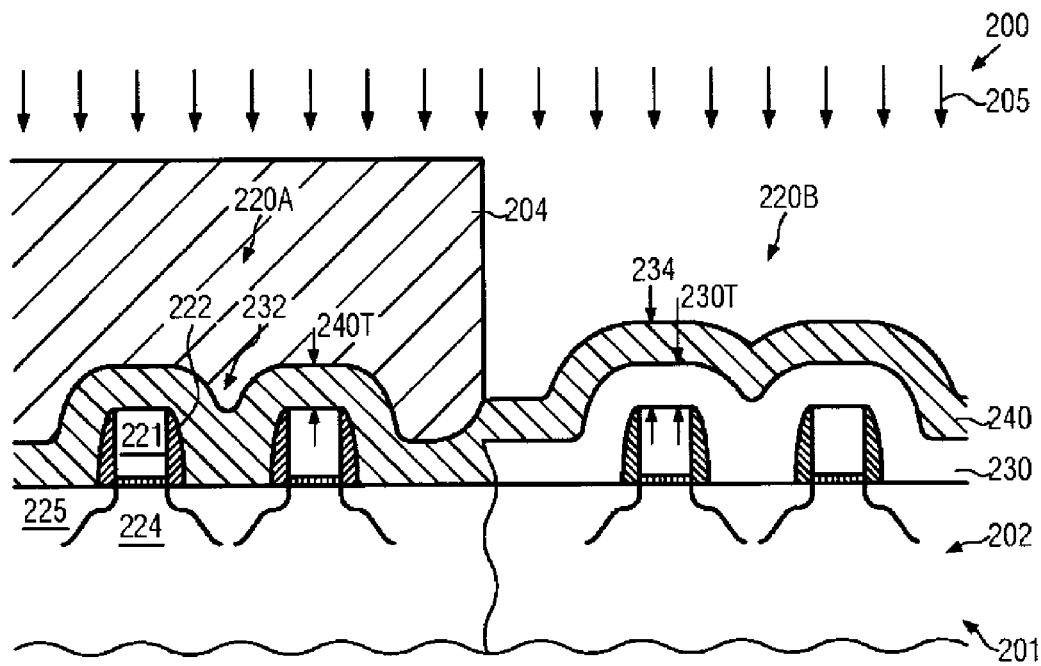
FIGS. 2c-2f schematically illustrate cross-sectional views of a semiconductor device during various manufacturing stages in forming differently stressed dielectric materials on the basis of appropriate process parameters, wherein an additional stressed dielectric material may be formed in accordance with illustrative embodiments.

FIG. 2c schematically illustrates a cross-sectional view of the semiconductor device 200, when representing an actual product device. Hence, a first device region 220A and a second device region 220B, which may correspond in their basic device architecture to the region 220A as shown in FIGS. 2a or 2b, may have formed therein respective transistor elements, as are also described with reference to FIGS. 2a and 2b. Furthermore, in the manufacturing stage shown, the dielectric layer 230 having a specific type of intrinsic stress may be formed above the transistor elements of the second device region 220B, thereby imparting a desired type of strain to the respective channel regions 224. Similarly, the dielectric layer 240 may be formed above the first device region 220A and above the layer 230 having a different type of intrinsic stress in order to enhance the performance of the transistors in the first device region 220A. The thickness of the respective layers 230, 240 may correspond to device requirements but may be, in some embodiments, within the corresponding maximum target values previously determined to provide the desired uniform patterning characteristics, as previously described. That is, the layer 230 may be formed on the basis of a maximum target value 230T, which may have been determined so as to not unduly affect the overall uniformity of the entire patterning sequence. Similarly, the layer 240 may be formed on the basis of a target value that ensures a high degree of uniformity, wherein the corresponding target values used may be within the range of allowable target values previously determined. It should be appreciated that the respective thicknesses 230T, 240T may differ from each other when a corresponding adaptation of performance gain may be considered appropriate in some illustrative embodiments. In other cases, the respective thicknesses may be set to similar values in view of a corresponding uniformity during the patterning process for forming respective contact openings, in which the layers 230, 240 may act as respective etch stop layers. Irrespective of the selection of the individual layer thickness, the combined thickness 234 of the layers 230, 240 may be selected so as to comply with the previously determined limitations of the patterning sequence, which may be substantially determined by the gap fill capabilities of the respective deposition process.

In the manufacturing stage shown in FIG. 2c, the device 200 may be exposed to an etch ambient 205 in order to remove the layer 240 above the second device region 220B on the basis of a corresponding resist mask 204. Due to the appropriate selection of the respective thickness 240T in combination with the thickness 230T, the exposed portion of the layer 240 may be substantially completely removed substantially without negatively affecting the layer 230. For instance, the etch process 205 may be performed on the basis of an appropriate etch indicator material, as for instance described with reference to FIGS. 1a-1c, while in other cases the corresponding etch indicator layer may be omitted and the etch process 205 may be controlled on other process parameters, such as etch time and the like. Thereafter the resist mask 204 may be removed, thereby obtaining the device 200 in a state having the layer 240 in the first device region 220A and the layer 230 in the second device region 220B. Thus, the semiconductor device 200 may be appropriately "prepared" for receiving a further dielectric material on the basis of a deposition process, as also used for the formation of the layers 230, 240, based on an appropriate target value for the thickness in order to comply with the respective constraints as defined by the combined thickness 234. That is, in this manufacturing stage, the device 200 is "prepared" for receiving a further stressed dielectric material with a thickness that may substantially correspond to the thickness 240T or a lower value, thereby providing a device configuration in which the deposition of the additional stressed dielectric material may result in a highly uniform layer stack without creating any non-uniformities, such as seam-like or void-like defects, which might lead to respective non-uniformities during the further processing.

Figure 2D:
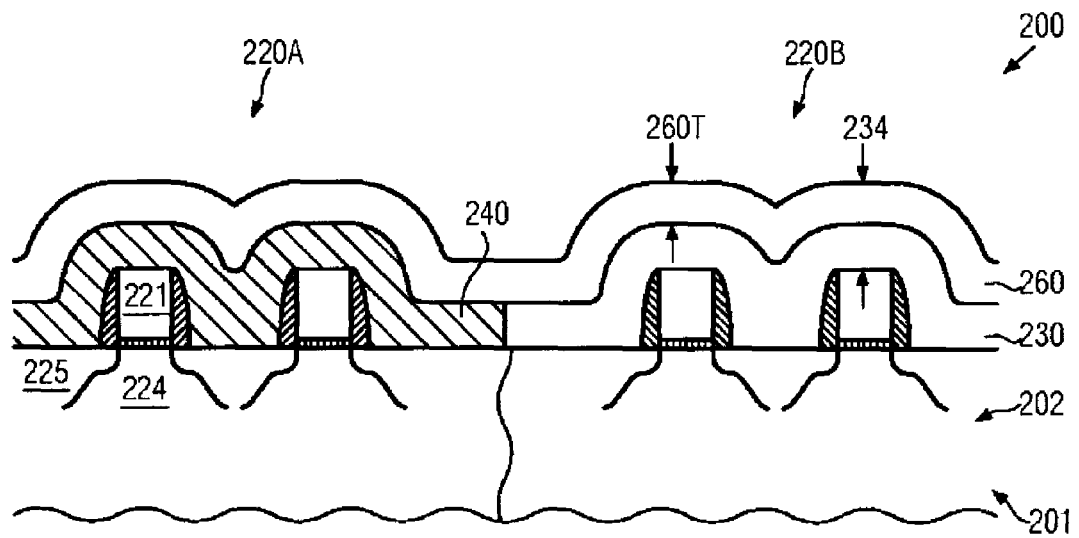

FIG. 2d schematically illustrates the semiconductor device 200 with an additional stressed dielectric layer 260 formed above the first and second device regions 220A, 220B. A thickness 260T of the layer 260 is selected so that the corresponding allowable range defined by the combined thickness 234 may not be exceeded in order to ensure uniformity during the further processing, as previously explained. For example, in some aspects, the maximum allowable thickness 260T for the layer 260 may be substantially obtained by determining the maximum allowable combined thickness 234, referred to as A, and subtracting the greater one of the layer thickness 230T, 240T. Thus, allowable thickness 260T approximately$\leq$A−max(230T, 240T), where max(230T, 240T) indicates the greater one of the thickness values 230T and 240T. In this way, the allowable maximum range 234 (A) may not be exceeded in any of the device regions 220A, 220B.

In the illustrative embodiment shown in FIG. 2d, the intrinsic stress of the layer 260 may correspond to the intrinsic stress of the layer 230, in order to enhance the performance of the respective transistors in the region 220B. For example, the region 220B may represent a region of P-type transistors, while the corresponding intrinsic stress of the layers 230, 260 may be a compressive stress. However, the layer 260 may be applied with a high tensile stress corresponding to the layer 240 in order to respectively increase transistor performance in the first device region 220A. Thus, by providing the additional layer 260, a high degree of flexibility may be provided in appropriately balancing respective strain-inducing mechanisms in the device 200. That is, typically two or more stress-inducing sources may be used, at least in one type of transistors, thereby typically requiring respective design measures for countering a respective imbalance in performance gain of the respective transistor elements. On the other hand, for a given design of the respective transistor elements, the additional layer 260 may provide enhanced capabilities for compensating for respective asymmetries in the respective stress-inducing sources or for finely tuning and thus balancing the performance gain of the different transistor types. For instance, highly efficient strain-inducing mechanisms on the basis of strained semiconductor alloys incorporated in respective drain and source regions of P-type transistors are available and may be combined with the stressed dielectric layers 230, 240 and 260 in order to obtain an overall performance gain of the device 200. In this case, the additional layer 260 may be used to balance or compensate for respective design modifications, which may occur in the manufacturing sequence for forming the respective strained semiconductor materials.

Figure 2E:
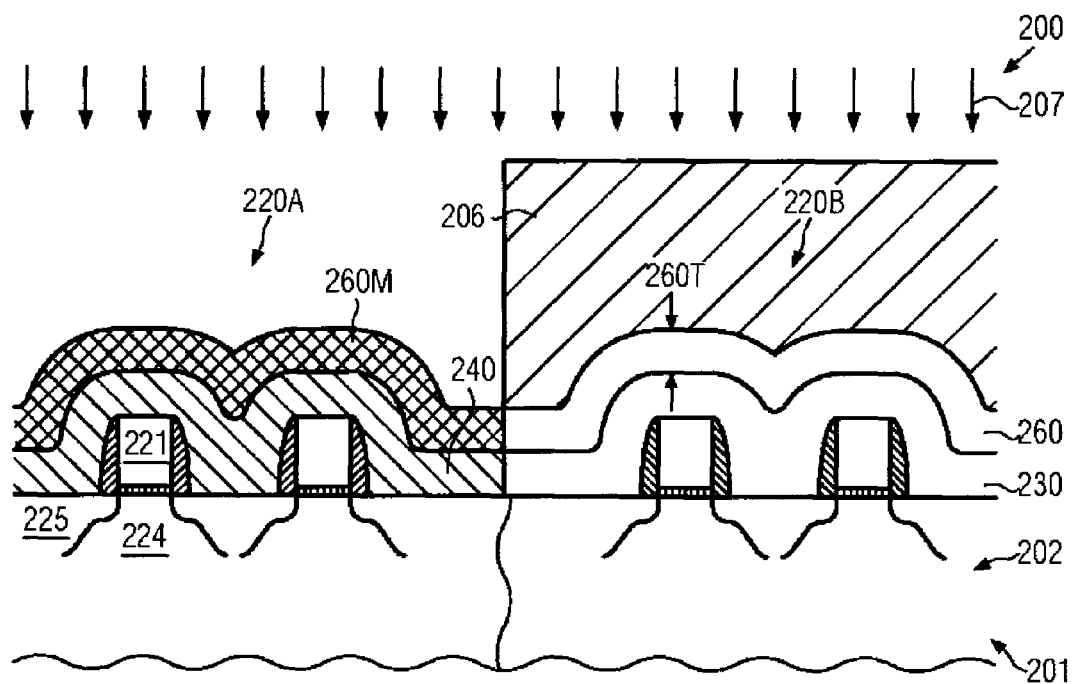

FIG. 2e schematically illustrates the semiconductor device 200 in accordance with further illustrative embodiments. Here, the device comprises a resist mask 206 for covering the second device region 220B while exposing the first device region 220A to a surface modification treatment 207. The process 207 may be designed so as to significantly reduce the intrinsic stress of the layer 260 in order to not unduly reduce performance of the transistor elements in the first region 220A. In one illustrative embodiment, the modification process 207 may represent an ion implantation process performed on the basis of an appropriate implantation species, such as inert material, for instance xenon, argon and the like. Thus, the implantation process may efficiently modify the molecular structure of the exposed portion of the layer 260, thereby significantly relaxing the intrinsic stress. Appropriate process parameters for the process 207 may be readily determined on the basis of simulation calculations, experiments and the like. Since the additional layer 260 may have been formed on the basis of an appropriately selected thickness 260T, which may provide a moderately conformal surface topography with respect to the underlying topography, as is previously explained, the corresponding modification process 207 may exhibit a high degree of uniformity across the entire exposed portion of the layer 260. Consequently, the corresponding relaxing effect of the treatment 207 may be obtained substantially throughout the entire thickness 260T, while not unduly affecting the lower lying material of the layer 240.

Figure 2F:
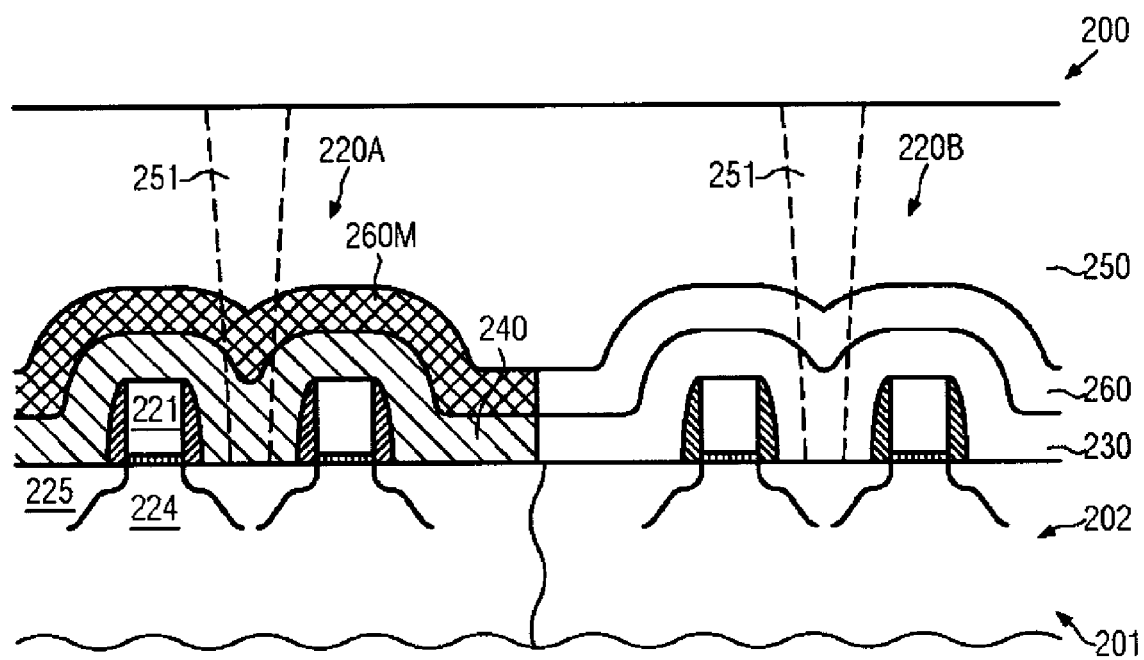

FIG. 2f schematically illustrates the semiconductor device 200 in a further advanced manufacturing stage. A respective dielectric material 250 may be formed above the first and second device regions 220A, 220B, for instance in the form of silicon dioxide and the like. The dielectric material 250 may be formed on the basis of well-established techniques, as previously described with reference to the device 100. In some illustrative embodiments, the material 250 may be provided as two or more sub-layers having different compositions or stress levels, when a further stress source may be desired. For example, the relaxed portion, indicated as 260M, may then act as a buffer layer when, for instance, a layer may be formed that may enhance the stress in the second device region 220B. In a next manufacturing process, respective openings 251 may be formed, as indicated by the dashed lines, wherein a high degree of process uniformity may be achieved due to the appropriate adaptation of the corresponding layer thickness during the preceding formation of the layers 230, 240 and 260. The layer 260 may provide enhanced transistor performance in the second device region 220B, while the relaxed portion 260M in the first device region 220A may provide a high degree of symmetry during the further processing of the device 200, for instance when forming the contact openings 251, while substantially not negatively affecting performance of the transistors in the first device region 220A.

It should be appreciated that, in other illustrative embodiments, the process 207 may represent an etch process designed to at least partially remove the exposed portion of the layer 260, when a corresponding different layer thickness may not be considered inappropriate during the further manufacturing processes. Also, in this case, the enhanced surface topography obtained by a previous process for forming the layers 230, 240 and 260 may provide enhanced etch uniformity, thereby enabling a substantially complete removal of the layer 260 above the first device region 220A.

Figure 3A:
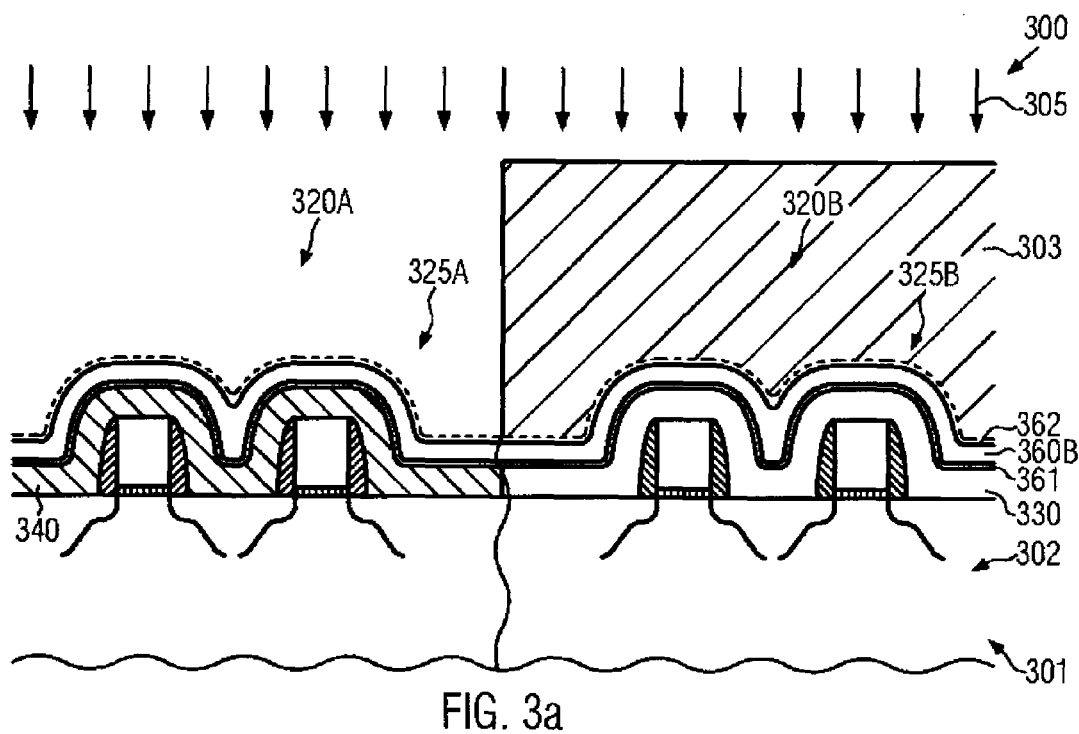
FIGS. 3a-3c schematically illustrate cross-sectional views of a semiconductor device during various manufacturing stages, wherein two differently stressed layers are formed in two steps for providing each sub-layer of the same type of stress within respective process margins dictated by the process techniques involved according to still further illustrative embodiments.
Figure 3B:
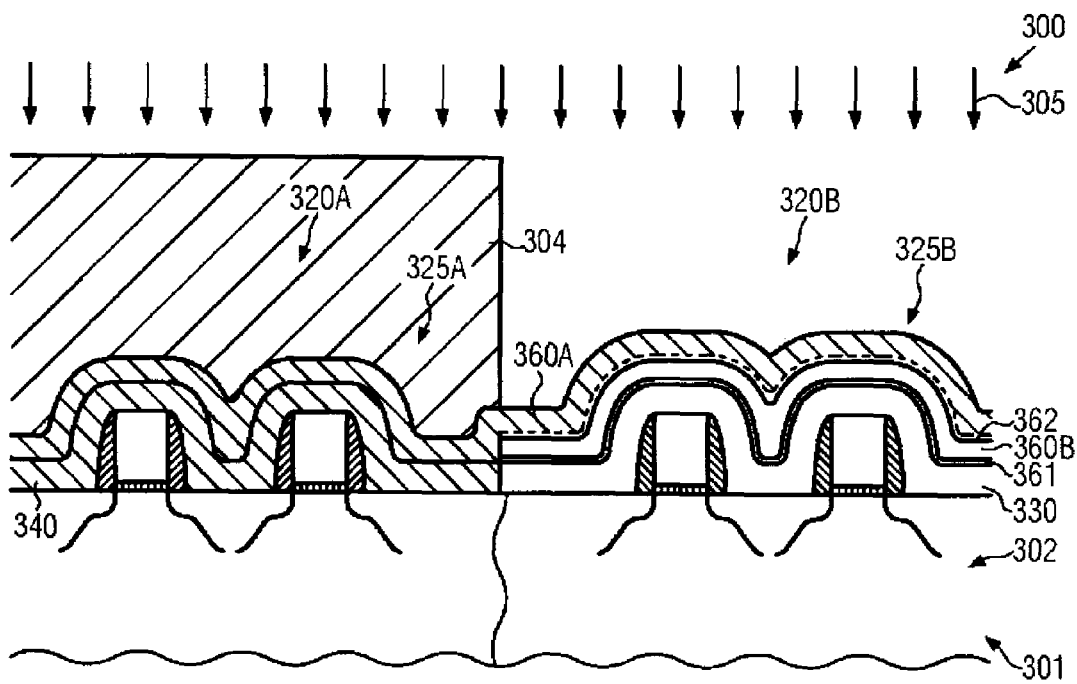
Figure 3C:
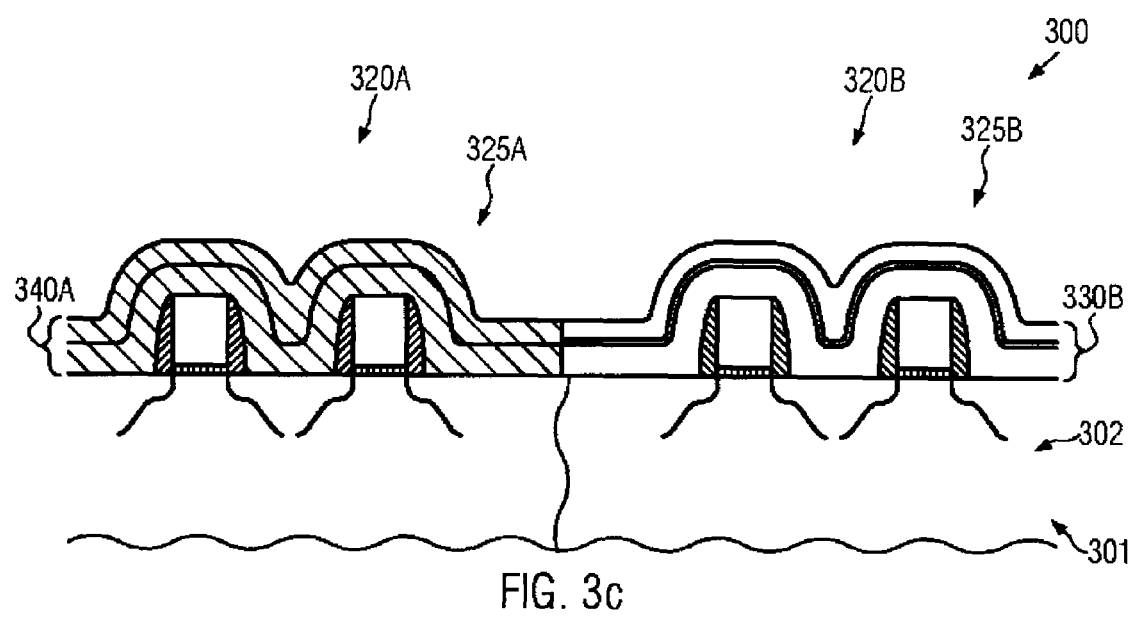

With reference to FIGS. 3a-3c, further illustrative embodiments will now be described in more detail, in which the separation of the deposition of the stress-inducing material into at least two separate steps may be used for dielectric material of different types of intrinsic stress in order to enhance the performance of N-type and P-type transistors, while reducing the process non-uniformities as described above.

FIG. 3a schematically illustrates a cross-sectional view of a semiconductor device 300 at an advanced manufacturing stage, wherein basically the device 300 may have a similar configuration as the device 200 as shown in FIG. 2c. Hence, a first device region 320A and a second device region 320B, which may correspond in their basic device architecture to the region 220A as shown in FIG. 2a or 2b, may have formed therein respective transistor elements 325A, 325B, respectively, as are also described with reference to FIGS. 2a and 2b. Furthermore, a dielectric layer 330 having a specific type of intrinsic stress, such as compressive stress, may be formed above the transistor elements 325B of the second device region 320B, thereby imparting a desired type of strain to the respective channel regions, as previously explained. Similarly, a dielectric layer 340 may be formed above the first device region 320A with a different type of intrinsic stress, such as a tensile stress, in order to enhance the performance of the transistors 325A in the first device region 320A. The thickness of the respective layers 330, 340 may correspond to device requirements but may be within approximately 50-150 nm. In some illustrative embodiments, the layer 330 may be formed on the basis of a maximum target value, which may have been determined so as to not unduly affect the overall uniformity of the entire patterning sequence. Similarly, the layer 340 may be formed on the basis of a target value that ensures a high degree of uniformity, wherein, for example, the corresponding target values used may be within the range of allowable target values previously determined. It should be appreciated that the respective thicknesses of the layers 330, 340 may differ from each other when a corresponding adaptation of performance gain may be considered appropriate in some illustrative embodiments, as will be explained later on with reference to FIGS. 4a and 4b.

In other cases, the respective thicknesses may be set to similar values in view of a corresponding uniformity during the patterning process for forming respective contact openings, in which the layers 330, 340 may act as respective etch stop layers.

Furthermore, in this manufacturing stage, the device 300 may further comprise an additional stress-inducing layer 360B having an intrinsic stress that may correspond to the intrinsic stress of the layer 330 so as to further increase the overall strain in the transistors 325B. In some embodiments, an etch stop layer or etch control layer 361 may be formed on the layers 340 and 330, which may be comprised of any appropriate material that provides a significant difference during a subsequent etch process for patterning the layer 360B. For example, the etch stop layer 361 may be comprised of silicon dioxide when the layer 360B is comprised of a silicon nitride based material. In some illustrative embodiments, the etch stop layer 361 may be provided to exhibit a moderately high intrinsic stress that, in the embodiment shown, may correspond to the intrinsic stress of the layer 360B.

Furthermore, in some illustrative embodiments, a further etch stop or etch control layer 362 may be provided on the layer 360B to provide enhanced etch control of an etch process for removing material from above the transistors 325B in a later stage.

The device 300 as shown in FIG. 3a may be formed on the basis of the following processes. After forming the transistors 325A, 325B that may have critical dimensions of 50 nm and significantly less above the substrate 301 and in and on the semiconductor layer 302 on the basis of sophisticated well-established process techniques, the stress-inducing layers may be formed by respective deposition and patterning strategies as previously explained. That is, the layer 330 may be formed with an appropriate thickness and may be patterned on the basis of well-established techniques. Thereafter, the layer 340 may be deposited and patterned, wherein, in both deposition and patterning processes, undue process non-uniformities may be reduced due to the selection of an appropriate deposition thickness. Next, the etch stop layer 361, if required, may be formed, for instance by deposition, surface treatment of the layers 330, 340, and the like. For example, the layer 361 may be deposited as a silicon dioxide layer having a high intrinsic compressive stress, when the layer 330 is a compressive stress layer. In other embodiments, the layer 361 may be deposited as a silicon layer and may be converted into an oxide layer, thereby obtaining a high compressive stress. Subsequently, the layer 360B may be deposited by appropriate deposition processes as previously described so as to obtain the same type of intrinsic stress as the layer 330. Since the layer 330 may have been provided with a reduced thickness in the preceding process sequence, the respective deposition process for the layer 360B may encounter deposition conditions that may enable the deposition of the material with high uniformity, thereby providing the potential for forming an increased overall layer thickness of stressed material above the transistors 325B without unduly contributing to process non-uniformities compared to a single deposition of the same material thickness in conventional strategies.

For example, if an initial thickness of the layers 330 and 340 has been selected in accordance with process capabilities, as previously described, the corresponding thickness of the layer 360B may be selected so that the further deposition and patterning of the layer 360B may not result in undue process non-uniformities, while nevertheless providing an increased overall amount of stress-inducing material. For a thickness in the range of approximately 90-110 nm of the layers 330, 340, the layer 360B may be provided with a thickness in the range of approximately 70-50 nm, thereby providing a combined thickness of approximately 160 nm or higher, while reducing the risk of introducing process-related defects, as is previously described. In some cases, when the etch stop layer 361 is provided, the layer 361 may be formed with high intrinsic stress, which may result in a substantially homogenous stressed material above the transistors 325B, thereby providing enhanced controllability of a subsequent etch process while not unduly affecting the overall stress transfer mechanism.

After forming the layer 360B and the optional etch stop layer 362, an etch mask 303, such as a resist layer and the like, may be formed to expose the layer 360B above the first transistors 325A, while covering the layer 360B above the second transistors 325B. Next, a selective etch process may be performed on the basis of well-established etch recipes to remove the exposed portion of the layer 360B on the basis of the etch stop layer 361. In other illustrative embodiments, the etch process may be performed as a controlled etch process with respect to etch time so as to remove the exposed portion of the layer 306B without providing the etch stop layer 361, thereby providing a homogenous and highly stressed material above the transistors 325B, when the etch stop material of the layer 361 may not be provided with the desired high intrinsic stress. During the etch time controlled process, the enhanced uniformity of the layer 340 may contribute to enhanced process uniformity of the etch time controlled process, thereby avoiding undue material removal from the layer 340. In other embodiments, the material removal caused by the etch process, when performed without the etch stop layer 361 or on the basis of the layer 361 having reduced etch stop capabilities, may be taken into consideration by a subsequent deposition of a further stressed material, as will be described later on. Hence, a respective loss of stressed material is less critical.

FIG. 3b schematically illustrates the device 300 in a further advanced manufacturing stage. As shown, a further stressed layer 360A is formed above the first and second transistors 325A, 325B, wherein the intrinsic stress of the layer 360A is designed to obtain a desired overall strain in the transistors 325A. For example, the layer 360A may be provided with high tensile stress, when the transistors 325A represent N-channel transistors. Moreover, an etch mask 305, such as a resist mask and the like, is formed to expose the layer 360A above the transistors 325B while covering the layer 360A above the transistors 325A.

The layer 360A may be formed on the basis of any appropriate deposition process, as previously explained, wherein an appropriate thickness may be selected. For example, when the layers 360A, 360B are comprised of substantially the same base material or at least of material having substantially the same etch behavior during a respective contact etch process, the thickness of the layer 360A may be selected similarly to the thickness of the layer 360B, when the layers 330 and 340 have similar thickness values. In this case, a highly uniform etch behavior during the contact etch process may be obtained. After the deposition of the layer 360A, the etch mask my be formed and the process 305 may be performed on the basis of well-established selective etch recipes. In some illustrative embodiments, the process 305 may be controlled on the basis of the layer 362, which may be provided in the form of an etch stop layer, etch indicator layer and the like, so as to efficiently determine an appropriate end point of the process 305, thereby reducing undue material removal of the highly stressed layer 360B.

FIG. 3c schematically illustrates the device 300 after the removal of the etch mask 304. Thus, a highly stressed dielectric material 340A, comprised of the layers 340 and 360A, is formed above the transistors 325A, while a highly stressed material 330B, comprised of the layers 330 and 360B and the optional layer 361, is located above the transistors 325B. Consequently, the transistors 325A, 325B may be separately provided with an appropriate stress-inducing material with reduced process-related non-uniformity by using two subsequent dual stress liner approaches.

It should be appreciated that, in other illustrative embodiments, a plurality of dual stress liner sequences may be performed, wherein each individual sequence may be performed within specific process conditions, which may result in an enhanced degree of process uniformity. Since, for instance, geometry-induced constraints, such as aspect ratio and the like, may be relaxed due to a previously performed dual liner sequence, performing several dual liner sequences may enable depositing a significantly increased amount of highly stressed material substantially without contributing to process-induced non-uniformities.

Figure 4A:
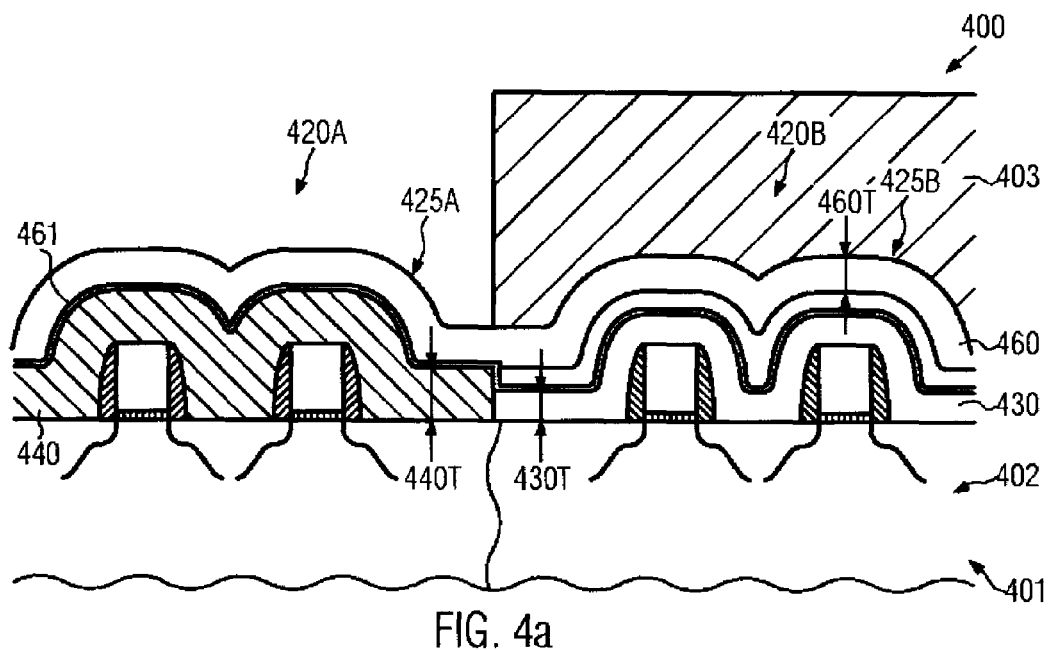
FIGS. 4a-4b schematically depict cross-sectional views of a semiconductor device during different manufacturing stages according to further illustrative embodiments, wherein one stress-inducing layer is formed in two different deposition processes so as to reduce the process constraints in each step while nevertheless providing an overall increased layer thickness.
Figure 4B:
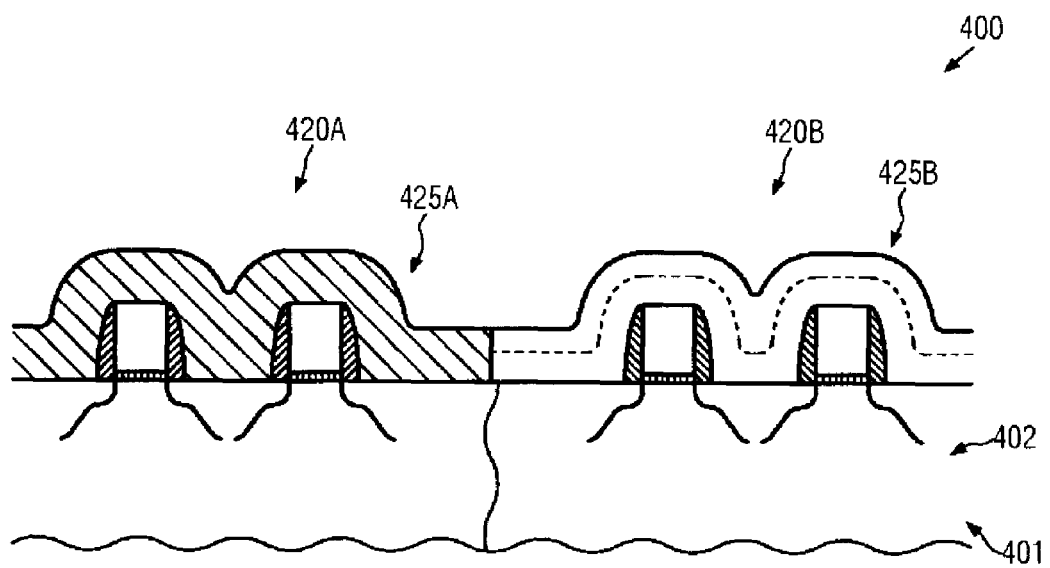

With reference to FIGS. 4a-4b, further illustrative embodiments will now be described in more detail, in which the dielectric material may be deposited in a first deposition step with a different thickness for different types of transistors, wherein an additional stressed material may then be provided for those transistors having received the base material with the reduced thickness.

FIG. 4a schematically illustrates a cross-sectional view of a semiconductor device 400 at an advanced manufacturing stage, wherein basically the device 400 may have a similar configuration as the device 200 as shown in FIG. 2c and the device 300, except for the configuration of respective stress-inducing layers. Hence, respective transistor elements 425A, 425B, respectively, may be provided and may represent, for example, N-channel transistors and P-channel transistors, respectively. Furthermore, a dielectric layer 430 having a specific type of intrinsic stress, such as compressive stress, may be formed above the transistor elements 425B, thereby imparting a desired type of strain to the respective channel regions, as previously explained. Similarly, a dielectric layer 440 may be formed above the first transistors 425A with a different type of intrinsic stress, such as a tensile stress, in order to enhance the performance of the transistors 425A. The thickness of the respective layers 430, 440 may be selected differently and may be within approximately 30-150 nm. For example, the layer 430 may have a reduced thickness 430T compared to a thickness 440T of the layer 440 so as to enable a subsequent deposition of an additional stressed material above the transistors 425B on the basis of well-defined conditions in order to obtain the desired increased amount of stressed material above the transistors 425B substantially without inducing process-related non-uniformities, as previously explained. For example, the layer 430 may be provided with a thickness of approximately 30-100 nm, for instance approximately 50 nm, which may result in a surface topography above the transistors 425B, which may enable an efficient removal of material of the layer 440 from the layer 430.

Moreover, the device 400 may comprise an optional etch stop layer or etch control layer 461 formed of any appropriate material, as previously described for the layer 361, 362. An additional stress-inducing layer 460 is formed above the transistors 425A, 425B with a thickness 460T that is selected to obtain the desired target thickness for stress-inducing material above the transistors 425B. For example, the combined thickness 460T plus 430T may be selected to substantially correspond to the thickness 440T, thereby providing substantially uniform process conditions during a respective contact etch process.

The device 400 as shown in FIG. 4a may be formed on the basis of process techniques as previously described with reference to the devices 200 and 300. For instance, the layer 430 may be formed with the thickness 430T that provides a sufficient process margin for forming the layer 440 with the final target thickness 440T and removing the layer 440 from above the transistors 425B, while substantially reducing any process-related non-uniformities. Thus, a dual stress liner approach may be used with the respective different thicknesses 430T, 440T. Thereafter, the etch stop or etch control layer 461 may be formed by deposition, surface treatment and the like, followed by the deposition of the layer 460, wherein the deposition conditions above the transistors 425B may result in reduced non-uniformities. Next, an etch mask 403 may be formed and the exposed portion of the layer 460 may be removed, wherein a respective process control may be used on the basis of the layer 461, if provided.

FIG. 4b schematically depicts the device 400 with the resist mask 403 removed. Hence, the layer 440 may provide the desired amount of strain in the transistors 425A, while the material of the combined layers 430 and 460 may provide the desired strain in the transistors 425B. Thus, based on a single additional stress-inducing layer, i.e., the layer 460, the performance of different transistors may be enhanced, since the layers 430, 440 and the layer 460, at least the portion above the transistors 425B, may be formed under enhanced process conditions, allowing reduction of process-related non-uniformities compared to conventional approaches, in which the stress-inducing material would be provided by a single dual stress liner approach. However, in highly scaled devices, respective non-uniformities created during the conventional dual stress liner sequence may not be compatible with further processing of the device, thereby requiring a reduction of the amount of stressed material that may be provided above respective transistor elements. Contrary thereto, the embodiments described herein provide increased amounts of stressed materials, while automatically respecting process- and geometry-related constraints. In the embodiments described with reference to FIGS. 4a-4b, a significant improvement of transistor performance may be obtained for N-channel transistors and P-channel transistors on the basis of a single additional stress-inducing layer due to the asymmetry in thickness of the layers provided in the initial dual stress liner approach.

As a result, the subject matter disclosed herein provides a technique for enhancing transistor performance for at least one type of transistors in highly scaled semiconductor devices by forming an additional stressed dielectric material on previously patterned dielectric layers of different types of intrinsic stress while respecting process limitations imposed by a device configuration under consideration and the capabilities of the respective deposition processes, possibly in combination with subsequent processes, such as the formation of etch indicator layers, etch stop layers and the like, which may optionally be provided during the patterning of the initial dielectric layers of different intrinsic stress. The additional dielectric material may thus provide an increased amount of stressed material in the vicinity of one or more types of transistors, wherein a substantially maximum amount of stressed material may be provided that is compatible with a respective patterning regime, while not unduly reducing the uniformity during the subsequent manufacturing processes.

In illustrative embodiments, a negative influence on the other type of transistor elements may be reduced or substantially completely avoided by performing a respective modification process, such as an ion implantation process or by removing the corresponding unwanted portion at least partially by an appropriate etch process. In other embodiments, dielectric material of different intrinsic stress may be formed in two or more sequences, thereby increasing the overall amount of stressed material above the different transistor types, while relaxing constraints for each individual sequence in forming the stressed material. Moreover, the two or more sequences may result in a less sophisticated device geometry, thereby also providing the potential to deposit an increased amount of material. Since a corresponding process sequence for providing differently stressed materials above respective transistors, i.e., a dual liner approach, may be established on the basis of a given device configuration and the capabilities of the respective deposition processes under consideration, the technique disclosed herein is self-scaling, once appropriate process parameters, that is, target values, for the deposition have been established.

For instance, for a device configuration corresponding to the 90 nm technology node, an appropriate target thickness for the respective compressive and tensile stressed dielectric layers may be approximately 110 nm, which may allow a thickness of the additional stressed layer of approximately 110 nm. In this case, a significant performance gain may be obtained for P-type transistors and/or N-type transistors, depending on whether the one or more additional stressed dielectric materials are provided with a compressive stress or a tensile stress or both. Measurements indicate an overall performance gain of approximately 5.5 percent for P-type transistors, without a performance loss of the N-type transistors, when a corresponding relaxation of the additional stressed layer is performed above the N-type transistors, as described above. On the other hand, a performance gain of approximately 5 percent for N-type transistors may be obtained without performance loss of the P-type transistors, when relaxing the additional layer above the P-type transistors, while using currently available silicon nitride deposition techniques. In other cases, the additional stressed material may be provided to enhance performance of both P-type transistors and N-type transistors compared to conventional dual stress liner approaches. In other cases, the dual stress liner sequence is performed on the basis of appropriate process conditions so as to avoid undue non-uniformities and at least one further dual stress liner sequence may then be performed to increase the total amount of stressed material above each type of transistors, while not unduly contributing to process nom-uniformities during the further processing of the devices, for instance with respect to forming contact openings and the like.

The provision of the additional stressed material may be combined with any appropriate patterning sequence for providing differently stressed dielectric layers above different transistor types, independently from the corresponding process sequence used. That is, the compressive dielectric material may be provided first and subsequently a tensile dielectric material may be patterned, wherein, afterwards, one or more additional stressed dielectric materials may be provided with compressive and/or tensile stress. Similarly, a sequence may be used in which the tensile dielectric material may be provided first followed by the compressive dielectric material, while the additional dielectric material(s) may be provided with any of tensile and/or compressive stress, depending on the process and device requirements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a first stress-inducing layer above a plurality of first transistors and a plurality of second transistors formed above a substrate, said first stress-inducing layer generating a first type of stress;
   removing said first-stress-inducing layer from above said plurality of second transistors;
   forming a second stress-inducing layer above said plurality of first transistors and said plurality of second transistors after removing said first-stress-inducing layer from above said plurality of second transistors, said second stress-inducing layer generating a second type of stress other than said first type of stress;
   removing said first-stress-inducing layer from above said plurality of first transistors; and
   forming a third stress-inducing layer above said portions of said first and second stress-inducing layers formed above said pluralities of first and second transistors, said third stress-inducing layer generating one of said first and second types of stress.

2. The method of claim 1, wherein a thickness of said first stress-inducing layer is different from a thickness of said second stress-inducing layer.

3. The method of claim 1, further comprising removing a portion of said third stress-inducing layer from above one of said pluralities of first and second transistors wherein a combined thickness of said third stress-inducing layer plus the one of the first and second stress-inducing layers over which the third stress-inducing layer remains is approximately equal to a thickness of the other of the first and second stress-inducing layers over which the third stress-inducing layer was removed.

4. The method of claim 1, further comprising:
   removing a portion of said third stress-inducing layer from above one of said pluralities of first and second transistors;
   forming a fourth stress-inducing layer generating a different type of stress relative to said third stress-inducing layer above said third stress-inducing layer and said pluralities of first and second transistors after removing said portion of said third-stress-inducing layer.

5. The method of claim 4, further comprising removing a portion of said fourth stress-inducing layer from above said third stress-inducing layer, wherein a combined thickness of said third stress-inducing layer plus the one of the first and second stress-inducing layers over which the third stress-inducing layer remains is approximately equal to a thickness of the other of the first and second stress-inducing layers over which the third stress-inducing layer was removed plus a thickness of said fourth stress-inducing layer.

6. The method of claim 1, further comprising reducing said stress generated by said third stress-inducing layer selectively above said first stress-inducing layer when said third stress-inducing layer generates said second type of stress, and reducing said stress generated by said third stress-inducing layer selectively above said second stress-inducing layer when said third stress-inducing layer generates said first type of stress.

7. The method of claim 1, wherein reducing said stress induced by said third stress-inducing layer comprises performing an ion implantation process while masking one of the first and second plurality of transistors.

8. The method of claim 5, further comprising removing a portion of said fourth-stress-inducing layer from above said one of said pluralities of first and second transistors from above which said third stress-inducing layer was removed while removing said portion of said fourth stress-inducing layer from above said third stress-inducing layer.

9. A method, comprising:
   forming a plurality of stress-inducing layers above a plurality of first transistors and a plurality of second transistors formed above a substrate;
   selectively removing portions of said stress-inducing layers from above said plurality of first transistors or said plurality of second transistors, where at least two of said plurality of stress-inducing layers remain over at least one of said plurality of first transistors or said plurality of second transistors, and a combined thickness of said stress-inducing layers remaining above said first plurality of transistors is approximately equal to a combined thickness of said stress-inducing layers remaining above said plurality of second transistors;
   forming an interlayer dielectric layer above said stress-inducing layers remaining above said pluralities of first and second transistors; and
   forming a first contact opening in said interlayer dielectric layer above at least one of said plurality of first transistors and a second contact opening in said interlayer dielectric layer above at least one of said plurality of second transistors.

* * * * *